(12) United States Patent
Falster et al.

(10) Patent No.: US 9,634,098 B2
(45) Date of Patent: Apr. 25, 2017

(54) OXYGEN PRECIPITATION IN HEAVILY DOPED SILICON WAFERS SLICED FROM INGOTS GROWN BY THE CZOCHRALSKI METHOD

(71) Applicant: MEMC Electronic Materials S.p.A., Novara (IT)

(72) Inventors: Robert J. Falster, London (GB); Vladimir V. Voronkov, Merano (IT)

(73) Assignee: SunEdison Semiconductor Ltd. (UEN201334164H), Singapore (SG)

( * ) Notice: Subject to any disclaimer, the term of this patent is extended or adjusted under 35 U.S.C. 154(b) by 0 days.

(21) Appl. No.: 13/914,925

(22) Filed: Jun. 11, 2013

(65) Prior Publication Data
US 2014/0361408 A1    Dec. 11, 2014

(51) Int. Cl.
H01L 21/322   (2006.01)
H01L 29/36    (2006.01)
H01L 21/223   (2006.01)
H01L 21/02    (2006.01)

(52) U.S. Cl.
CPC ........ H01L 29/36 (2013.01); H01L 21/02694 (2013.01); H01L 21/223 (2013.01); H01L 21/3225 (2013.01)

(58) Field of Classification Search
CPC ...... H01L 21/3225; H01L 21/22; C30B 15/00
USPC ................ 257/347, 607, E21.321, E21.135, 257/E29.086, E23.137
See application file for complete search history.

(56) References Cited

U.S. PATENT DOCUMENTS

| | | | |
|---|---|---|---|
| 3,204,159 A | 8/1965 | Bramley et al. | |
| 4,667,218 A | 5/1987 | Takahashi et al. | |
| 5,327,007 A * | 7/1994 | Imura et al. | 257/610 |
| 6,277,501 B1 | 8/2001 | Fujikawa | |
| 6,547,875 B1 * | 4/2003 | Nakajima et al. | 117/13 |
| 6,894,366 B2 * | 5/2005 | Howard et al. | 257/565 |
| 6,905,771 B2 | 6/2005 | Ono et al. | |
| 7,485,928 B2 | 2/2009 | Falster et al. | |
| 7,939,441 B2 | 5/2011 | Kusaba et al. | |
| 8,026,145 B2 | 9/2011 | Falster et al. | |
| 2003/0104222 A1 | 6/2003 | Ono et al. | |
| 2007/0105279 A1 | 5/2007 | Falster et al. | |
| 2007/0207595 A1 | 9/2007 | Kurita | |
| 2008/0038526 A1 | 2/2008 | Kume et al. | |
| 2009/0004426 A1* | 1/2009 | Falster et al. | 428/64.1 |
| 2009/0017291 A1* | 1/2009 | Sadamitsu et al. | 428/336 |

(Continued)

FOREIGN PATENT DOCUMENTS

WO    2009075288 A1    6/2009

OTHER PUBLICATIONS

Invitation to Pay Additional Fees regarding PCT/US2014/0339363 mailed on Aug. 7, 2014, 8 pgs.

(Continued)

*Primary Examiner* — Marcos D Pizarro
(74) *Attorney, Agent, or Firm* — Armstrong Teasdale LLP

(57) ABSTRACT

A method for controlling oxygen precipitation in a single crystal silicon wafer having a wafer resistivity of less than about 10 milliohm-cm is provided so that the wafer has uniformly high oxygen precipitation behavior from the central axis to the circumferential edge. The single crystal silicon wafer comprises an additional dopant selected from among carbon, arsenic, and antimony.

20 Claims, 1 Drawing Sheet

(56) References Cited

U.S. PATENT DOCUMENTS

2011/0300371 A1    12/2011    Omote et al.

OTHER PUBLICATIONS

International Search Report and Written Opinion of the International Searching Authority regarding PCT/US2014/039363 mailed on Nov. 5, 2014, 16 pgs.
Bardeen, John, "Research Leading to Point-Contact Transistor", Science, Jul. 19, 1957, vol. 126, No. 3264, pp. 105-112.
Jain, R. K., "Calculation of the Fermi Level, Minority Carrier Concentration, Effective Intrinsic Concentration, and Einstein Relation in n- and p-Type Germanium and Silicon", Phys. Stat. Sol., 1977, vol. 42, No. 221, pp. 221-226.
Porrini, M., "Impact of antimony doping on microdefect formation in Czochralski grown silicon crystals", Cryst. Res. Technol., Sep. 15, 2005, vol. 40, No. 10-11, pp. 1054-1059.
Voronkov, Vladimir et al., "Void properties in silicon heavily doped with arsenic and phosphorus", Phys. Status Solidi A., Aug. 20, 2012, vol. 209, No. 10, pp. 1898-1901.

\* cited by examiner

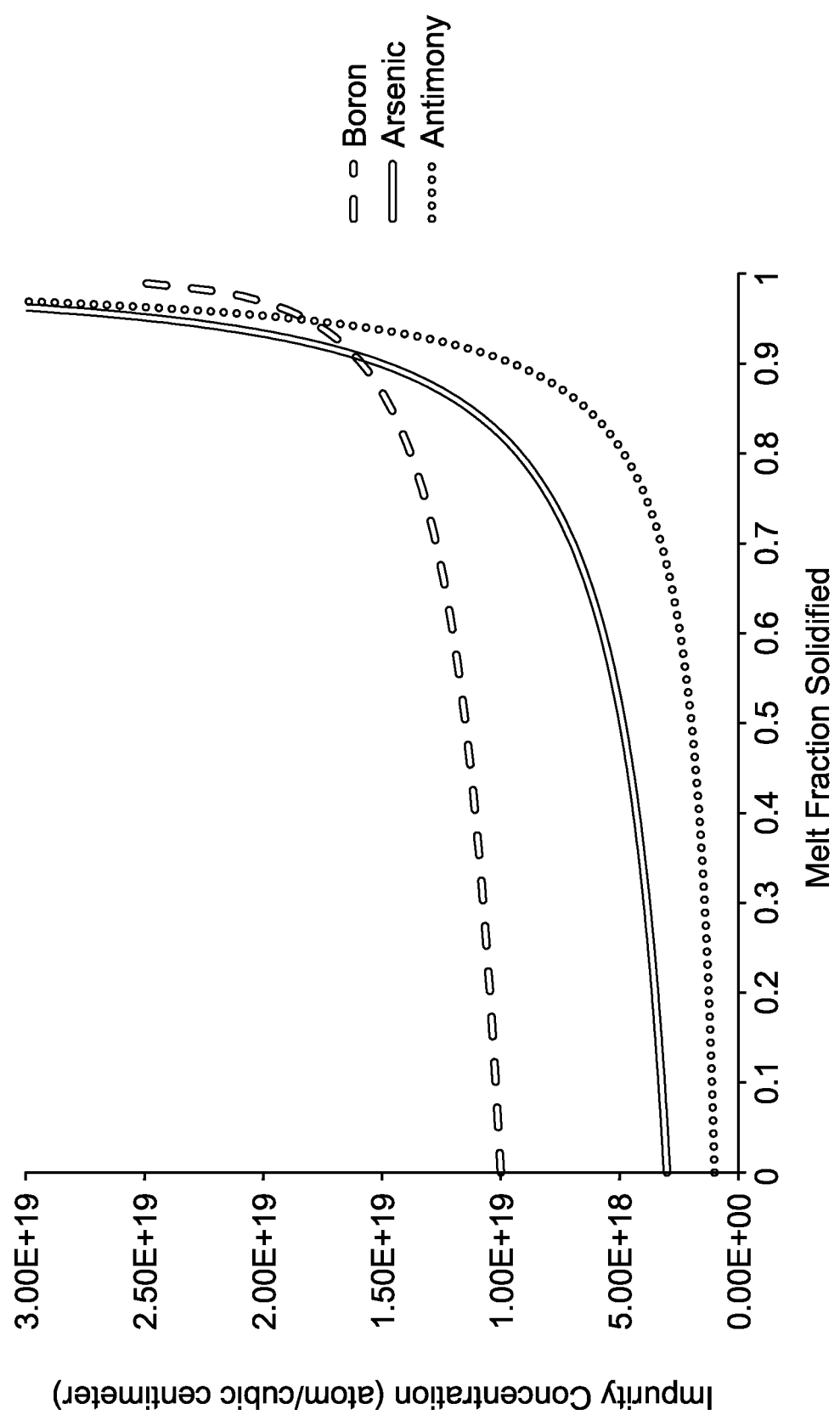

OXYGEN PRECIPITATION IN HEAVILY DOPED SILICON WAFERS SLICED FROM INGOTS GROWN BY THE CZOCHRALSKI METHOD

THE FIELD OF THE INVENTION

The present invention generally relates to a method for the control of oxygen precipitation behavior in low resistivity silicon wafers, and more specifically to a method of providing uniform oxygen precipitation in low resistivity silicon wafers sliced from Czochralski-grown silicon ingots.

BACKGROUND OF THE INVENTION

Single crystal silicon, which is the starting material for most processes for the fabrication of semiconductor electronic components, is commonly prepared with the so-called Czochralski (Cz) process wherein a single seed crystal is immersed into molten silicon and then grown by slow extraction. Molten silicon is contaminated with various impurities, among which is mainly oxygen, during the time it is contained in a quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in the solidified silicon. Such concentrations are greater than the solubility of oxygen in solid silicon at temperatures typical for the processes used to fabricate electronic devices. As the crystal grows from the molten mass and cools, therefore, the solubility of oxygen in it decreases rapidly, whereby in the wafers sliced from the crystal, oxygen is present in supersaturated concentrations.

Thermal treatment cycles typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Oxygen precipitation behavior in CZ silicon material is strongly influenced by intrinsic point defect concentrations. For example in lightly doped material, generally strong precipitation is observed in vacancy type material whereas in interstitially type material, no precipitation occurs.

SUMMARY OF THE INVENTION

Briefly, the present invention is directed to a method for controlling oxygen precipitation in a single crystal silicon wafer having a wafer resistivity of less than about 10 milliohm-cm. The single crystal silicon wafer is sliced from an ingot grown by the Czochralski method and comprising a front surface, a back surface, a central plane between the front and back surfaces, a circumferential edge joining the front and back surface, a central axis perpendicular to the central plane, a bulk layer which comprises the region of the wafer between the central plane and front surface, and an additional dopant selected from the group consisting of carbon at a mean carbon concentration of at least $5 \times 10^{17}$ atoms per cubic centimeter, arsenic at a mean arsenic concentration at least about $3 \times 10^{18}$ atoms per cubic centimeter, and antimony at a mean antimony concentration of at least about $5 \times 10^{17}$ atoms per cubic centimeter. The method comprises heating the single crystal silicon wafer having a wafer resistivity of less than 10 milliohm-cm at a temperature and for a duration sufficient to precipitate oxygen precipitates at an average concentration of at least about $5 \times 10^8$ precipitates/cm$^3$ from the central axis to the circumferential edge, wherein the heat treated single crystal silicon wafer comprises no annular region in which the oxygen precipitate concentration is less than about $5 \times 10^8$ precipitates/cm$^3$.

The present invention is further directed to a single crystal silicon wafer having a wafer resistivity of less than about 10 milliohm-cm, the single crystal silicon wafer sliced from an ingot grown by the Czochralski method and comprising a front surface, a back surface, a central plane between the front and back surfaces, a circumferential edge joining the front and back surface, a central axis perpendicular to the central plane, and a bulk layer which comprises the region of the wafer between the central plane and front surface. The wafer further comprises oxygen precipitates at an average concentration of at least about $5 \times 10^8$ precipitates/cm$^3$ from the central axis to the circumferential edge, wherein the single crystal silicon wafer comprises no annular region in which the oxygen precipitate concentration is less than about $5 \times 10^8$ precipitates/cm$^3$.

The present invention is still further directed to a single crystal silicon wafer sliced from an ingot grown by the Czochralski method, the single crystal silicon wafer having a wafer resistivity of less than about 10 milliohm-cm, the single crystal silicon wafer sliced from an ingot grown by the Czochralski method and comprising a front surface, a back surface, a central plane between the front and back surfaces, a circumferential edge joining the front and back surface, a central axis perpendicular to the central plane, and a bulk layer which comprises the region of the wafer between the central plane and front surface. The wafer comprises boron dopant at a mean boron concentration of at least about $1 \times 10^{19}$ atoms per cubic centimeter. The wafer also comprises a second dopant selected from the group consisting of carbon at a mean carbon concentration of at least about $5 \times 10^{17}$ atoms per cubic centimeter, arsenic at a mean arsenic concentration of at least about $3 \times 10^{18}$ atoms per cubic centimeter, and antimony at a mean antimony concentration of at least about $5 \times 10^{17}$ atoms per cubic centimeter.

The present invention is still further directed to a method of controlling the oxygen precipitation behavior in a single crystal silicon wafer, the wafer sliced from a Czochralski grown single crystal silicon ingot. The method comprises growing a boron-doped single crystal silicon ingot by the Czochralski method, the boron-doped single crystal silicon ingot comprising a region of relatively constant diameter, wherein at least a portion of the region of relatively constant diameter of the single crystal silicon ingot comprises boron dopant at a mean boron concentration of at least about $1 \times 10^{19}$ atoms per cubic centimeter and a second dopant selected from the group consisting of carbon at a mean carbon concentration of at least about $5 \times 10^{17}$ atoms per cubic centimeter, arsenic at a mean arsenic concentration of at least about $3 \times 10^{18}$ atoms per cubic centimeter, and antimony at a mean antimony concentration of at least about $5 \times 10^{17}$ atoms per cubic centimeter.

Other objects and features of this invention will be in part apparent and in part pointed out hereinafter.

BRIEF DESCRIPTION OF THE DRAWINGS

The FIGURE is a graph depicting the expected boron, arsenic, and antimony concentrations as a fraction of the melt solidified.

DETAILED DESCRIPTION OF THE PREFERRED EMBODIMENTS

According to the present invention, a method is provided for preparing highly doped single crystal silicon wafers, which exhibit high and uniform oxygen precipitation behavior. In some embodiments of the present invention, the highly doped single crystal silicon wafers uniformly precipitate oxygen precipitates independently of growth mode or dopant concentration. The underlying principle of the invention is to shift the control of the intrinsic point defect concentration from the details of the crystal growth mode (v/G) to another mechanism whereby the crystal can be made to be of uniformly high intrinsic point defect, vacancy or interstitial, concentration thereby making the precipitation uniformly high everywhere in the crystal ingot regardless of the details of crystal growth or dopant concentration profile.

According to the present invention, the mechanism by which this is achieved is to grow the single crystal silicon ingot with one or more additional impurities at concentrations substantially lower than the concentration of the primary dopant, which dictates the electrical properties, i.e., resistivity, of the wafer. The additional impurities added during single crystal silicon ingot growth add extra vacancies or extra self-interstitials to the ingot, independently of the growth conditions. According to some embodiments, the impurity may add significant concentrations of intrinsic point defects even when the concentration of the impurity itself is modest.

According to some embodiments of the present invention, an impurity is added during single crystal silicon ingot growth which increases the concentration of silicon self-interstitials. For example, carbon impurity in the single crystal silicon ingot may add extra self-interstitials through the following reaction:

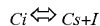

$Ci \Leftrightarrow Cs + I$

Due to a small but appreciable interstitial component of the carbon impurity, excess self-interstitials are added to the existing grown-in concentration. The community of point defects Ci and I make a community of interstitial point defects existing in a mutual exchange.

According to some embodiments of the present invention, an impurity is added during single crystal silicon ingot growth which increases the vacancy concentration. In some embodiments, the impurity added during crystal growth which increases the vacancy concentration comprises antimony, Sb. In some embodiments, the impurity added during crystal growth which increases the vacancy concentration comprises arsenic, As. Sb and As impurities add to the vacancy concentration through the community of V—Sb and V—As complexes coexisting with vacancies.

Therefore, for example, in the case of heavily doped crystals, e.g., heavily boron-doped crystals, of arbitrary potential point defect type and concentration (as would be controlled by a combination of v/G and [B]) the actual intrinsic point defect concentration and type can be controlled independently through the addition of relatively low concentrations of these impurities. For example, by the addition of sufficient concentrations of carbon, the crystal may be made everywhere strongly interstitial type whereas though the addition of sufficient concentrations of As or Sb the ingot may be made everywhere strongly vacancy type. In either embodiment, uniformly high oxygen precipitation may be achieved. Advantageously, the high and uniform oxygen precipitation may be achieved independently of the growth conditions of the single crystal silicon ingot and/or independently of thermal process (e.g., rapid thermal anneals) designed to imprint a crystal lattice vacancy template within a wafer sliced from a single crystal silicon ingot.

a. Czochralksi-Grown Single Crystal Silicon Ingots

In some embodiments, the present invention is directed to a method of controlling the oxygen precipitation behavior in a single crystal silicon wafer sliced from a Czochralski grown single crystal silicon ingot. In some embodiments, the method comprises growing a single crystal silicon ingot by the Czochralski method with a high boron dopant concentration and an additional dopant in order to increase the concentration of intrinsic point defects.

Single crystal silicon ingots may be grown according to the standard Czochralski method. Single crystal silicon ingots are grown in a crystal puller. See, e.g., U.S. Pat. No. 6,554,898 and WO 99/27165 (both assigned to MEMC Electronic Materials), the disclosures of which are incorporated herein as if set forth in their entireties. A typical Cz puller comprises a housing; a crucible in the housing for containing molten silicon; a pulling mechanism for pulling a growing ingot upward from the molten silicon; and heating mechanism in proximity sufficient to melt solid silicon starting material (i.e., a polycrystalline charge comprising polycrystalline granules and/or chunk polycrystalline) into a molten silicon bath. Polycrystalline material may be charged to the crucible according to techniques known in the art, e.g., as described in WO 99/55940 (assigned to MEMC Electronic Materials).

Ingot growth according to the Czochralski method begins by melting a charge of solid silicon starting material by applying power to the heating mechanism. See, e.g., WO 99/20815 (assigned to MEMC Electronic Materials). The melt flow may be stabilized by crucible rotation rate, inert gas flow rate, etc. prior to dipping a seed crystal into the melt. Pulling the seed upwards crystallizes the melt at the solid-liquid interface and the crystal proceeds to grow. A conical neck of increasing diameter from the seed crystal is grown by decreasing the pulling rate of the seed crystal from the melt. Once the desired diameter is reached, the pull rate is gradually increased until the crystal grows a substantially constant diameter region. The heating mechanisms of the crystal pulling apparatus are controlled in order to control the solidification and cooling rate of the growing silicon ingot. The crucible is rotated in the opposite sense to the crystal to stabilize the melt flow and control the oxygen concentration in the crystal. The final stage of the crystal growth is the tail growth where the diameter is slowly decreased and a conical shape is achieved, in which the diameter of the end cone decreases in the axial direction from the constant diameter region toward the end of the crystal. Once the crystal has detached from the melt the power to the puller is decreased and the crystal is cooled down while being lifted into the upper chamber. At the end of the process, the crystal is removed from the puller for further processing.

According to previous publications (see, e.g., WO 98/45507, WO 98/45508, WO 98/45509, and WO 9845510, all assigned to MEMC Electronic Materials), the type and initial concentration of intrinsic point defects is initially determined as the ingot cools from the temperature of solidification (i.e., about 1410° C.) to a temperature greater than 1300° C. That is, the type and initial concentration of these defects are controlled by the ratio v/G, where v is the growth velocity and G is the average axial temperature gradient over this temperature range. As the value of v/G increases, a transition from decreasingly self-interstitial dominated growth to increasingly vacancy dominated growth occurs near a critical value of $v/G_o$ which, based upon currently available information, appears to be about $2.1 \times 10^{-5}$ $cm^2/sK$, where $G_o$ is determined under conditions in which the axial temperature gradient is constant within the temperature range defined above. At this critical value, the concentrations of these intrinsic point defects are at equilibrium.

As the value of $v/G_o$ exceeds the critical value, the concentration of vacancies increases. Likewise, as the value of $v/G_o$ falls below the critical value, the concentration of self-interstitials increases. It has been observed that the oxygen precipitation behavior in non- and lightly-doped single crystal silicon wafers sliced from Cz grown crystals is heavily dependent upon the type and concentration of intrinsic point defects, specifically, the vacancy concentration. In heavily doped material the situation is more complicated. For example, in heavily boron doped materials ([B]>about $1 \times 10^{19}$ atoms/cm$^3$) heavy precipitation is observed in both vacancy and interstitial type material with the exception of a narrow band between the vacancy and interstitial regions where the grown-in vacancy or self-interstitial concentration is very low. As a result, no oxygen precipitation occurs in this region after subjecting such a wafer to a heating process known for causing oxygen precipitation, e.g., the NEC1 process. Such wafers exhibit an annular region of no oxygen precipitation, surrounded by an inner core comprising oxygen precipitates (generally, a vacancy dominant region, but other configurations are possible) and an outer annular ring comprising oxygen precipitates (generally, an interstitial dominant region, but other configurations are possible). This can lead to difficulties in the control of oxygen precipitation performance in such heavily doped material. In some cases, it may not be practical to avoid regions of low crystal-growth controlled intrinsic point defect concentrations due to requirements on hot zones, pull rates, or resistivity specifications. The present invention is directed to a method for ensuring uniform and high oxygen precipitation behavior in heavily doped silicon substrates by the addition of impurities during the crystal growth process. These impurities may increase either intrinsic point defect, even at relatively modest concentrations. The additional impurity or dopant may be selected from among carbon, arsenic, and antimony. In some embodiments, the additional dopant comprises carbon at a mean carbon concentration of at least $5 \times 10^{17}$ atoms per cubic centimeter. In some embodiments, the additional dopant comprises arsenic at a mean arsenic concentration at least about $3 \times 10^{18}$ atoms per cubic centimeter. In some embodiments, the additional dopant comprises antimony at a mean antimony concentration of at least $5 \times 10^{17}$ atoms per cubic centimeter.

In some embodiments, the silicon melt may be doped with boron during crystal growth sufficient to yield a single crystal silicon ingot having an average concentration of boron atoms of at least about $1 \times 10^{19}$ atoms/cm$^3$. The high dopant concentration in the silicon melt enables the preparation of single crystal silicon segments, e.g., wafers, having low resistivity of about 10 milliohm-cm and lower. In some embodiments, the high dopant concentration in the silicon melt enables the preparation of single crystal silicon segments, e.g., wafers, having low resistivity of about 9 milliohm-cm and lower. The boron dopant concentration may be as high as about $3.8 \times 10^{20}$ atoms/cm$^3$ while still achieving monocrystallinity of the final CZ ingot.

In some embodiments, the additional dopant comprises carbon at a mean carbon concentration of at least $5 \times 10^{17}$ atoms per cubic centimeter (which is about 10 ppma). Carbon concentrations above that which affect the monocrystallinity of the silicon ingot should be avoided.

In some embodiments, the additional dopant comprises arsenic at a mean arsenic concentration at least about $3 \times 10^{18}$ atoms per cubic centimeter. Since boron is a P-type dopant and arsenic impurity is an N-type dopant, the upper limit of arsenic dopant can be no greater than an amount that adversely affects the single crystal silicon wafer's desired resistivity of about 10 milliohm-cm or less, or about 9 milliohm-cm or less, or about 5 milliohm-cm or less, or about 2 milliohm-cm or less, or even about 1 milliohm-cm or less. Stated another way, the addition of an N-type dopant, such as arsenic, should be limited such that the added N-type dopant does not vary the overall resistivity of the wafer by any more than about 20% of the desired resistivity, more preferably by no more than about 10% of the desired resistivity.

In some embodiments, the additional dopant comprises antimony at a mean antimony concentration of at least about $5 \times 10^{17}$ atoms per cubic centimeter. Since boron is a P-type dopant and antimony impurity is an N-type dopant, the upper limit of antimony dopant can be no greater than an amount that adversely affects the single crystal silicon wafer's desired resistivity of less than 10 milliohm-cm, or about 9 milliohm-cm or less, or about 5 milliohm-cm or less, or about 2 milliohm-cm or less, or even about 1 milliohm-cm or less. Stated another way, the addition of an N-type dopant, such as antimony, should be limited such that the added N-type dopant does not vary the overall resistivity of the wafer by any more than about 20% of the desired resistivity, more preferably by no more than about 10% of the desired resistivity.

B. Low Resistivity Single Crystal Silicon Wafers

The single crystal silicon wafer of the present invention is a silicon wafer which has been sliced from a single crystal ingot grown in accordance with conventional Czochralski ("Cz") crystal growing methods, typically having a nominal diameter of at least about 150 mm, at least about 200 mm, at least about 250 mm, at least about 300 mm, at least about 400 mm, at least about 450 mm, or more. The wafer may be polished or, alternatively, lapped and etched but not polished. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications.

The wafer preferably has a front surface, a back surface, an imaginary central plane between the front and back surfaces and substantially parallel to the front and back surfaces, and a circumferential edge joining the front surface and the back surface. The wafer additionally comprises an imaginary central axis perpendicular to the central plane and a radial length that extends from the central axis to the circumferential edge. The terms "front" and "back" in this context are used to distinguish the two major, generally planar surfaces of the wafer. The front surface of the wafer (as that phrase is used herein) is not necessarily the surface onto which an electronic device will subsequently be fabricated, nor is the back surface of the wafer (as that phrase is used herein) necessarily the major surface of the wafer which is opposite the surface onto which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The single crystal silicon wafer is sliced from a Czochralski grown single crystal silicon ingot, which as described above is doped with a p type dopant in sufficient concentration to have an average resistivity of about 20 milliohm-cm or less, preferably about 9 milliohm-cm or less. In view thereof, the single crystal silicon wafer also has an average resistivity of about 20 milliohm-cm or less, about 10 milliohm-cm or less, preferably about 9 milliohm-cm or less, or about 5 milliohm-cm or less, or about 2 milliohm-cm or less, or even about 1 milliohm-cm or less. In some embodiments, the wafer is doped with doped with boron at an average concentration of boron atoms of at least about $1 \times 10^{19}$ atoms/cm$^3$. In some embodiments, the silicon wafer has a boron dopant concentration as high as about $3.8 \times 10^{20}$ atoms/cm$^3$.

The wafer may have an oxygen concentration falling anywhere within the range attainable by the Cz process. In some embodiments, the wafers of the present invention have an oxygen concentration of about $4.5 \times 10^{17}$ atoms/cm$^3$ to about $5.5 \times 10^{17}$ atoms/cm$^3$, i.e., about 9 PPMA to about 11 PPMA. In some embodiments, the wafers of the present invention have an oxygen concentration of less than about $4.5 \times 10^{17}$ atoms/cm$^3$, less than about 9 PPMA. In some embodiments, the wafers have an oxygen concentration of about $5.5 \times 10^{17}$ atoms/cm$^3$ to about $8 \times 10^{17}$ atoms/cm$^3$, i.e., about 11 PPMA to about 16 PPMA. In some embodiments, the wafers have an oxygen concentration of about $6 \times 10^{17}$ atoms/cm$^3$ to about $9 \times 10^{17}$ atoms/cm$^3$, i.e., about 12 PPMA to about 18 PPMA. In some embodiments, the wafers have an oxygen concentration of about $7.5 \times 10^{17}$ atoms/cm$^3$ to about $8.5 \times 10^{17}$ atoms/cm$^3$, i.e., about 15 PPMA to about 17 PPMA.

In some embodiments, the single crystal silicon wafer of the present invention comprises carbon at a mean carbon concentration of at least about $5 \times 10^{17}$ atoms per cubic centimeter. In some embodiments, the carbon concentration may be less than about $2 \times 10^{18}$ atoms per cubic centimeter.

In some embodiments, the single crystal silicon wafer of the present invention comprises arsenic at a mean arsenic concentration at least about $3 \times 10^{18}$ atoms per cubic centimeter. In some embodiments, the arsenic concentration is no greater than an amount that adversely affects the single crystal silicon wafer's desired resistivity of about 10 milliohm-cm or less, or about 9 milliohm-cm or less, or about 5 milliohm-cm or less, or about 2 milliohm-cm or less, or even about 1 milliohm-cm or less. Stated another way, the addition of an N-type dopant, such as arsenic, should be limited such that the added N-type dopant does not vary the overall resistivity of the wafer by any more than about 20% of the desired resistivity, more preferably by no more than about 10% of the desired resistivity.

In some embodiments, the single crystal silicon wafer of the present invention comprises antimony at a mean antimony concentration of at least about $5 \times 10^{17}$ atoms per cubic centimeter. In some embodiments, the antimony concentration is no greater than an amount that adversely affects the single crystal silicon wafer's desired resistivity of about 10 milliohm-cm or less, or about 9 milliohm-cm or less, or about 5 milliohm-cm or less, or about 2 milliohm-cm or less, or even about 1 milliohm-cm or less. Stated another way, the addition of an N-type dopant, such as antimony, should be limited such that the added N-type dopant does not vary the overall resistivity of the wafer by any more than about 20% of the desired resistivity, more preferably by no more than about 10% of the desired resistivity.

C. Oxygen Precipitation Heat Treatment

According to the method of the present invention, a single crystal silicon wafer of low resistivity is subjected to a thermal process at a temperature and for a duration sufficient to precipitate oxygen precipitates. Advantageously, the wafers of low resistivity comprise impurities that either render the wafer interstitial dominant from the central axis to the circumferential edge (e.g., carbon) or vacancy dominant from the central axis to the circumferential edge (e.g., arsenic and antimony). By including such impurities at relatively modest concentrations, the oxygen precipitation behavior of the wafers is independent of the growth conditions of the single crystal silicon ingot. In addition, oxygen precipitation behavior of the wafers of the present invention is independent of any crystal lattice vacancy profile that may be imprinted within the wafer by, for example, a rapid thermal anneal.

Any thermal treatment sufficient to nucleate and grow oxygen precipitates is suitable for preparing wafers of the present invention with uniform and high oxygen precipitates throughout the wafer, i.e., from the central axis to the circumferential edge and further from the front surface of the wafer to the back surface of the wafer. In some embodiments, the wafers are subjected to an oxygen precipitation heat-treatment at a temperature in excess of about 700° C. for a duration sufficient to nucleate and grow oxygen precipitates. In some embodiments, the wafers are subjected to an oxygen precipitation heat treatment comprising the NEC1 test procedure, e.g., annealing the wafer for 4-8 hours at 800° C. and then 16 hours at 1000° C. In some embodiments, the oxygen precipitation heat treatment prepares wafers comprising oxygen precipitates at an average concentration from the central axis to the circumferential edge of at least about $5 \times 10^8$ precipitates/cm$^3$. In some embodiments, the oxygen precipitation heat treatment prepares wafers comprising oxygen precipitates at an average concentration from the central axis to the circumferential edge of at least about $1 \times 10^9$ precipitates/cm$^3$. In some embodiments, the oxygen precipitation heat treatment prepares wafers comprising oxygen precipitates at an average concentration from the central axis to the circumferential edge of at least about $5 \times 10^9$ precipitates/cm$^3$. In some embodiments, the oxygen precipitation heat treatment prepares wafers comprising oxygen precipitates at an average concentration from the central axis to the circumferential edge of at least about $1 \times 10^{10}$ precipitates/cm$^3$.

D. Post-Processing of Wafers

Silicon wafers of the present invention may be used in a variety of applications. For example, such wafers having a bare silicon surface polished to a specular finish (i.e., a polished wafer) may be used directly in an integrated circuit manufacturing process. Alternatively, the wafer may be used as a substrate for epitaxial deposition or SOI (by layer transfer or oxygen implantation).

1. Etching

If desired, the near-surface region of the wafers, e.g., generally up to about 2 micrometers, may be substantially, or even entirely, removed by chemical etching using etchants and techniques conventional in the art.

2. Polishing

If desired, the wafer may be chemically or chemomechanically polished to a specular finish prior to or after oxygen precipitation.

3. Epitaxial Layer

The wafer may be prepared for epitaxial layer deposition. If an epitaxial layer is to be deposited on the wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The epitaxial layer may be deposited onto the entire wafer, or, alternatively, onto only a portion of the wafer. The epitaxial layer preferably is deposited onto the front surface of the wafer. More preferably, it is deposited onto the entire front surface of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

The wafer surfaces may comprise an oxide or nitride layer. For example, a silicon oxide layer forms on a silicon surface when it is exposed to air at room temperature and generally has a thickness of from about 10 to about 15 Å. Preferably, the nitride, oxide, or nitride/oxide layer is removed from the surface of the wafer before the epitaxial layer is deposited onto the surface.

Removal of a silicon oxide or nitride/oxide layer may be accomplished by heating the surface of the wafer in an oxidant-free atmosphere until the oxide or nitride/oxide layer is removed from the surface. For example, the surface of the wafer is preferably heated to a temperature of at least about 1100° C., and more preferably to a temperature of at least about 1150° C. This heating preferably is conducted while exposing the surface of the wafer to an atmosphere comprising $H_2$ or a noble gas (e.g., He, Ne, or Ar). More preferably, the atmosphere comprises $H_2$. Most preferably, the atmosphere consists essentially of $H_2$ because use of other atmospheres tends to cause etch pits to form in the surface of the wafer.

Generally, it is preferable to heat the wafer surface to remove the silicon oxide or nitride/oxide layer and then initiate silicon deposition less than 30 seconds (more preferably within about 10 seconds) after the oxide or nitride/oxide is removed. Generally, this may be accomplished by heating the wafer surface to a temperature of at least about 1100° C. (more preferably at least about 1150° C.) and then initiating the silicon deposition less than 30 seconds (more preferably within about 10 seconds) after the wafer surface reaches that temperature. Waiting to initiate silicon deposition for up to about 10 seconds after removal of the silicon oxide or nitride/oxide layer allows the temperature of the wafer to stabilize and become uniform.

Alternatively, the oxide or nitride/oxide layer may be chemically stripped. In embodiments where the silicon surface has a nitride/oxide layer, chemical stripping is the preferred means for removing the nitride/oxide layer. Chemical stripping may be done by means known in the art using phosphoric acid, hydrofluoric acid, or other acids as are known. In another alternative, the oxide or nitride/oxide layer may be etched by plasma etching, using, for example, eMAX from Applied Materials, or other methods as are known in the art.

In embodiments where the surface layer is predominantly a silicon nitride layer, the nitride layer may be removed by polishing, chemical etching, or plasma etching (such as eMAX from Applied Materials, or other etching methods as are known in the art).

The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature.

The rate of growth of the epitaxial deposition preferably is from about 0.5 to about 7.0 µm/min. A rate of about 3.5 to about 4.0 µm/min may be achieved, for example, by using an atmosphere consisting essentially of about 2.5 mole % $SiHCl_3$ and about 97.5 mole % $H_2$ at a temperature of about 1150° C. and an absolute pressure of up to about 1 atm.

In some applications, the wafers comprise an epitaxial layer which imparts electrical properties. In some embodiments, the epitaxial layer is lightly doped with phosphorous. Therefore, the ambient for epitaxial deposition comprises phosphorous present as a volatile compound, such as, for example, phosphine, $PH_3$. In some embodiments, the epitaxial layer can contain boron. Such a layer may be prepared by, for example, including $B_2H_6$ in the atmosphere during the deposition.

Epitaxial deposition typically requires a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. The epitaxial wafers of the present invention may be cleaned by methods known in the art.

4. Silicon on Insulator (SOI)

A silicon on insulator structure generally comprises a device layer, a handle wafer or supporting layer, and an insulating film or layer (typically an oxide layer) between the supporting layer and the device layer. Generally, the device layer is between about 0.5 and 20 micrometers thick. Silicon on insulator structures may be prepared using various techniques known in the art, such as SIMOX or BESOI.

SOI structures may be prepared, for example, by the SIMOX process by subjecting the wafer to an ion implantation process which is standard in the art. (See, e.g., U.S. Pat. No. 5,436,175 and *Plasma Immersion Ion Implantation for Semiconductor Processing*, Materials Chemistry and Physics 46 (1996) 132-139, both of which are incorporated herein by reference).

SOI structures may also be prepared by bonding two wafers and removing a portion of one of the bonded wafers. For example, SOI structures can be prepared by the BESOI process, wherein the wafer is bonded to another wafer, and then a substantial portion of one of the wafers is etched away using known wafer thinning techniques to obtain the device layer. (See, e.g., U.S. Pat. Nos. 5,024,723 and 5,189,500 which are incorporated herein by reference.)

In view of the above, it will be seen that the several objects of the invention are achieved. The following example will illustrate the invention.

Example 1

Segregation of Arsenic and Antimony in Boron-Doped Silicon Wafers

Highly boron doped single crystal silicon ingots are grown from a silicon melt by the Czochralski method. The ingots are doped with an additional dopant, arsenic or antimony. The FIGURE is a graph depicting the expected boron, arsenic, and antimony concentrations as a fraction of the melt solidified. The data presented in the chart of the FIGURE was obtained using the following calculation:

$$C(X) = C_0 * (1-X)^{(k_{seg}-1)}$$

wherein:

$C(X)$ is the dopant concentration at a point along the constant diameter portion of the ingot;

$C_0$ is the initial dopant concentration at the beginning of the constant diameter portion of the ingot;

X is the fraction of the ingot that is frozen;

$k_{seg}$ is the segregation coefficient.

Since boron has a segregation coefficient of 0.80, the concentration of boron as a function of the fraction of the melt solidified is relatively constant throughout most of the ingot growth. As can be seen from the FIGURE, the boron concentration does not begin to deviate significantly from a concentration with the range between about $1.0 \times 10^{19}$ atoms/$cm^3$ to about $1.5 \times 10^{19}$ atoms/$cm^3$ until nearly about 90% of the melt is solidified. Since the segregation coefficients of arsenic and antimony are lower, at 0.3 and 0.023, respectively, these dopants accumulate in the melt at significant concentrations relatively earlier during crystal growth, thereby resulting in ingots having significantly higher dopant concentrations at the end of the constant diameter portion of the ingot compared to the beginning of the constant diameter portion of the ingot.

The graph depicted in the FIGURE enables the selection of highly boron doped low resistivity single crystal silicon wafers sliced from ingots that are doped with boron and one of arsenic or antimony so that the wafers have predictable and low resistivities, while still being doped with arsenic and phosphorus so that the wafers have high concentrations of vacancies and thus additionally have uniformly high oxygen precipitation behavior from the central axis of the wafer to the circumferential edge.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A p-type single crystal silicon wafer sliced from an ingot grown by the Czochralski method, the p-type single crystal silicon wafer having a wafer resistivity of less than about 10 milliohm-cm, the p-type single crystal silicon wafer sliced from an ingot grown by the Czochralski method and comprising a front surface, a back surface, a central plane between the front and back surfaces, a circumferential edge joining the front and back surface, a central axis perpendicular to the central plane, and a bulk layer which comprises the region of the wafer between the central plane and front surface, wherein the p-type single crystal silicon wafer is vacancy dominant from the central axis to the circumferential edge, the p-type single crystal silicon wafer comprising:

boron dopant at a mean boron concentration of at least about $1 \times 10^{19}$ atoms per cubic centimeter; and arsenic at a mean arsenic concentration of at least about $3 \times 10^{18}$ atoms per cubic centimeter; and oxygen precipitates at an average concentration of at least about $5 \times 10^8$ precipitates/$cm^3$ from the central axis to the circumferential edge, wherein the single crystal silicon wafer comprises no annular region in which the oxygen precipitate concentration is less than about $5 \times 10^8$ precipitates/$cm^3$.

2. A p-type single crystal silicon wafer sliced from an ingot grown by the Czochralski method, the p-type single crystal silicon wafer having a wafer resistivity of less than about 10 milliohm-cm, the p-type single crystal silicon wafer sliced from an ingot grown by the Czochralski method and comprising a front surface, a back surface, a central plane between the front and back surfaces, a circumferential edge joining the front and back surface, a central axis perpendicular to the central plane, and a bulk layer which comprises the region of the wafer between the central plane and front surface, wherein the p-type single crystal silicon wafer is vacancy dominant from the central axis to the circumferential edge, the p-type single crystal silicon wafer comprising:

boron dopant at a mean boron concentration of at least about $1 \times 10^{19}$ atoms per cubic centimeter; and antimony at a mean antimony concentration of at least about $5 \times 10^{17}$ atoms per cubic centimeter; and oxygen precipitates at an average concentration of at least about $5 \times 10^8$ precipitates/cm$^3$ from the central axis to the circumferential edge, wherein the single crystal silicon wafer comprises no annular region in which the oxygen precipitate concentration is less than about $5 \times 10^8$ precipitates/cm$^3$.

3. A p-type single crystal silicon wafer sliced from an ingot grown by the Czochralski method, the p-type single crystal silicon wafer having a wafer resistivity of less than about 10 milliohm-cm, the p-type single crystal silicon wafer sliced from an ingot grown by the Czochralski method and comprising a front surface, a back surface, a central plane between the front and back surfaces, a circumferential edge joining the front and back surface, a central axis perpendicular to the central plane, and a bulk layer which comprises the region of the wafer between the central plane and front surface, the p-type single crystal silicon wafer comprising:
   boron dopant at a mean boron concentration of at least about $1 \times 10^{19}$ atoms per cubic centimeter; and
   a second dopant selected from the group consisting of arsenic at a mean arsenic concentration of at least about $3 \times 10^{18}$ atoms per cubic centimeter, antimony at a mean antimony concentration of at least about $5 \times 10^{17}$ atoms per cubic centimeter, and a combination thereof, wherein the concentration of the second dopant is less than the concentration of the boron dopant; and
   oxygen precipitates at an average concentration of at least about $5 \times 10^8$ precipitates/cm$^3$ from the central axis to the circumferential edge, wherein the single crystal silicon wafer comprises no annular region in which the oxygen precipitate concentration is less than about $5 \times 10^8$ precipitates/cm$^3$.

4. The p-type single crystal silicon wafer of claim 3 comprising arsenic at a mean arsenic concentration at least about $3 \times 10^{18}$ atoms per cubic centimeter and antimony at a mean antimony concentration of at least about $5 \times 10^{17}$ atoms per cubic centimeter.

5. The p-type single crystal silicon wafer of claim 3 comprising arsenic at a mean arsenic concentration at least about $3 \times 10^{18}$ atoms per cubic centimeter.

6. The p-type single crystal silicon wafer of claim 3 comprising antimony at a mean antimony concentration of at least about $5 \times 10^{17}$ atoms per cubic centimeter.

7. The p-type single crystal silicon wafer of claim 3 having a wafer resistivity of less than about 5 milliohm-cm.

8. The p-type single crystal silicon wafer of claim 3 comprising oxygen precipitates at an average concentration of at least about $1 \times 10^{10}$ precipitates/cm$^3$.

9. The p-type single crystal silicon wafer of claim 3 wherein the concentration of the second dopant is less than $1 \times 10^{19}$ atoms per cubic centimeter.

10. The p-type single crystal silicon wafer of claim 3 wherein the concentration of the second dopant is less than $5 \times 10^{18}$ atoms per cubic centimeter.

11. The p-type single crystal silicon wafer of claim 3 comprising an oxygen concentration between about $4.5 \times 10^{17}$ atoms/cm$^3$ and about $5.5 \times 10^{17}$ atoms/cm$^3$.

12. The p-type single crystal silicon wafer of claim 3 comprising an oxygen concentration of less than about $4.5 \times 10^{17}$ atoms/cm$^3$.

13. The p-type single crystal silicon wafer of claim 3 comprising an oxygen concentration between about $5.5 \times 10^{17}$ atoms/cm$^3$ and about $8 \times 10^{17}$ atoms/cm$^3$.

14. The p-type single crystal silicon wafer of claim 3 comprising an oxygen concentration between about $6 \times 10^{17}$ atoms/cm$^3$ and about $9 \times 10^{17}$ atoms/cm$^3$.

15. The p-type single crystal silicon wafer of claim 3 comprising an oxygen concentration between about $7.5 \times 10^{17}$ atoms/cm$^3$ and about $8.5 \times 10^{17}$ atoms/cm$^3$.

16. The p-type single crystal silicon wafer of claim 3 comprising oxygen precipitates at an average concentration of at least about $1 \times 10^9$ precipitates/cm$^3$.

17. The p-type single crystal silicon wafer of claim 16 comprising no annular region in which the oxygen precipitate concentration is less than about $1 \times 10^9$ precipitates/cm$^3$.

18. The p-type single crystal silicon wafer of claim 3 comprising oxygen precipitates at an average concentration of at least about $5 \times 10^9$ precipitates/cm$^3$.

19. The p-type single crystal silicon wafer of claim 18 comprising no annular region in which the oxygen precipitate concentration is less than about $5 \times 10^9$ precipitates/cm$^3$.

20. The p-type single crystal silicon wafer of claim 19 comprising no annular region in which the oxygen precipitate concentration is less than about $1 \times 10^{10}$ precipitates/cm$^3$.

* * * * *